United States Patent
Moto et al.

(10) Patent No.: US 8,121,160 B2
(45) Date of Patent: Feb. 21, 2012

(54) DRIVER CIRCUIT FOR SEMICONDUCTOR LASER DIODE DRIVEN IN DIFFERENTIAL MODE

(75) Inventors: Akihiro Moto, Yokohama (JP); Katsumi Uesaka, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/402,671

(22) Filed: Mar. 12, 2009

(65) Prior Publication Data

US 2009/0238226 A1      Sep. 24, 2009

(30) Foreign Application Priority Data

Mar. 19, 2008   (JP) ................................. 2008-071993

(51) Int. Cl.
*H01S 3/00*   (2006.01)

(52) U.S. Cl. ............... 372/38.02; 372/38.01; 372/38.07; 330/127; 330/258; 330/259; 330/260; 330/261; 330/278; 330/279

(58) Field of Classification Search ............... 372/38.01, 372/38.02, 38.07; 330/127, 258, 259, 260, 330/261, 278, 279
See application file for complete search history.

(56) References Cited

U.S. PATENT DOCUMENTS

| | | | | |
|---|---|---|---|---|
| 6,064,261 | A * | 5/2000 | Stein et al. | 330/252 |
| 6,583,661 | B1 * | 6/2003 | Tanji et al. | 327/355 |
| 6,661,288 | B2 * | 12/2003 | Morgan et al. | 330/258 |
| 7,227,878 | B1 * | 6/2007 | Choi et al. | 372/38.02 |
| 7,483,459 | B2 * | 1/2009 | Uesaka et al. | 372/38.02 |
| 7,499,479 | B2 * | 3/2009 | Nishimura | 372/38.1 |
| 7,502,400 | B2 * | 3/2009 | Preisach | 372/38.02 |
| 7,514,997 | B2 * | 4/2009 | Adut | 330/256 |
| 7,656,753 | B2 * | 2/2010 | Fujiie et al. | 369/13.26 |
| 7,684,452 | B1 * | 3/2010 | Draper et al. | 372/38.02 |
| 2005/0105573 | A1 * | 5/2005 | Hayashi et al. | 372/38.01 |
| 2005/0117615 | A1 * | 6/2005 | Fujiie et al. | 372/38.04 |
| 2007/0098026 | A1 * | 5/2007 | Uesaka et al. | 372/29.01 |

FOREIGN PATENT DOCUMENTS

| | | |
|---|---|---|
| JP | 06-275895 A | 9/1994 |
| JP | 2002-158395 A | 5/2002 |

* cited by examiner

*Primary Examiner* — Yuanda Zhang
(74) *Attorney, Agent, or Firm* — Venable LLP; Michael A. Sartori; Christopher Ma

(57) ABSTRACT

A driver circuit for a semiconductor laser diode (LD) is disclosed, in which the driver circuit drives the LD in the differential mode and lowers the power consumption thereof. The driver circuit includes a differential unit to provide the modulation current to the LD, a voltage converter to provide a positive power supply to the differential unit, a detector to detect the common mode voltage of the differential outputs of the unit, and a comparing unit to control the voltage converter dynamically such that the output common mode voltage is set in a preset reference level.

6 Claims, 3 Drawing Sheets

DRIVER CIRCUIT FOR SEMICONDUCTOR LASER DIODE DRIVEN IN DIFFERENTIAL MODE

BACKGROUND OF THE INVENTION

1. Field of the Invention

The present invention relates to a driver circuit for a semiconductor laser diode (hereafter denoted as LD), in particular, the invention relates to a driver circuit for the LD operated in the differential mode.

2. Related Prior Art

Various prior patent applications have disclosed a driver circuit for the LD in which the driver circuit applies a modulation voltage or current directly to the LD, which is called as the direct modulation. One type of the directly modulation circuits provides a switching transistor connected in series to the LD receives a modulation signal in the control node thereof to switch the current applied to the LD directly. The driver circuit often includes an automatic power control (hereafter denoted as APC) circuit that may keep the average power and the extinction ratio of the light output from the LD constant.

Because the LD has large temperature dependence in the emission efficiency thereof, a larger driving current becomes necessary in high temperatures compared with that in a low temperature or in a room temperature to maintain the average power and the extinction ratio. Moreover, the emission efficiency is widely scatted in individual LDs, which requests a driver circuit with a higher power supply to operate an LD with lower emission efficiency even when an LD shows better efficiency.

A Japanese patent application published as JP-H06-275895A and another application published as JP-2002-158395A have disclosed a driver circuit implemented with a voltage converter for the power supply of the driver circuit. The former application, JP-H06-275895A, provides a circuit to monitor a bias condition between the drain and the source of the transistor, and adjusts the bias applied to the LD based on this monitored condition. While, the latter application, JP-2002-158395A, has a circuit to monitor the drain bias of the transistor and adjusts the bias to the LD by this monitored drain bias.

One type of driving modes for the LD has been known as the differential mode, in which the driver circuit provides a paired transistors each having a load resistor to constitute a differential circuit, and the LD is connected between the outputs of the outputs of the differential circuit to modulate the light output from the LD. Moreover, even when the driver circuit is configured with the differential mode, the APC circuit may adjust the modulation current and the bias current to keep the average power and the extinction ratio of the light output from the LD constant.

Eve in such a driver circuit with the differential mode, it is necessary for the driver circuit to provide a power supply with higher voltages because the LD is necessary to be supplied with a larger current due to a less emission efficient at high temperatures, which becomes a barrier for the lower power consumption. However, the driver circuit with the differential mode is inevitable to secure the complementarity of the paired transistor, which restricts the prior technique disclosed in the application above listed to be implemented within the driver circuit with the differential mode.

Therefore, the present invention is to provide a driver circuit for the LD with the differential mode that is able to reduce the power consumption.

SUMMARY OF THE INVENTION

One aspect of the present invention relates to a driver circuit for the semiconductor laser diode (LD) that comprises a differential unit, a voltage converter, a first detector unit and a comparing unit. The differential unit has two inputs and two outputs. The LD is connected between the two outputs to be driven in the differential mode by the differential unit. The voltage converter provides a power supply to the differential unit. The first detector unit detects the common mode level of the two outputs. The comparing unit compares the common mode level with a first reference. In the present invention, the voltage converter adjusts the power supply such that the common mode level detected by the first detector unit becomes substantially equal to the first reference.

According to the driver circuit of the invention, the comparing unit may adjust the power supply so as to keep the output common mode level of the differential unit even when the modulation current increases, which operates to lower the common mode level of the differential unit, depending on the temperature variation or the emission efficiency of the individual LD. Thus, the driver circuit of the invention may dynamically set the power supply for the differential unit in an adequate level enough to drive the LD, which is unnecessary to prepare a margin of the power supply.

The driver circuit of the invention may further provide another detector to detect an input common mode level of the differential unit and may adjust the power supply such that a difference between the output common mode level and the input common mode level is kept constant to a preset value. The driving signal input to the differential unit sometimes varies the common mode level thereof. Under such a condition, the differential unit becomes unable to keep an adequate operating condition thereof. The driver circuit with the other detector unit for the input common mode level may keep the adequate operating condition of the differential unit.

Another aspect of the present invention relates to an optical transmitter that provides an LD, a bias current source, a driver circuit including the modulation current source, and an automatic power control loop that includes a photodiode to detect an optical output power from the LD, an APC unit, the bias current source and the modulation current source. The APC loop may keep the optical output power substantially constant by controlling the bias current source and the modulation current source depending on the optical output power detected by the PD.

In the optical transmitter of the invention, the comparing unit that receives the output common mode level of the differential unit may adjust the power supply for the differential unit in response to the variation of the modulation current which is determined by the APC loop. The output common mode level decreases when the modulation current increases, while, it increases when the modulation current decreases due to the large temperature dependence of the LD or the widely scattered performance of the LD, especially, the emission efficiency thereof and the its temperature dependence. The optical transmitter of the invention may dynamically adjust the output common mode levels of the differential unit following the magnitude of the modulation current determined by the APC loop. Therefore, the optical transmitter is unnecessary to prepare an enough margin in the power supply for the LD with good performance.

DESCRIPTION OF PREFERRED EMBODIMENTS

Next, preferred embodiments according to the present invention will be described as referring to accompanying drawings. In the description of the drawings, the same numerals or the same symbols will refer to the same elements without overlapping explanations.

First Embodiment

Figure 1:
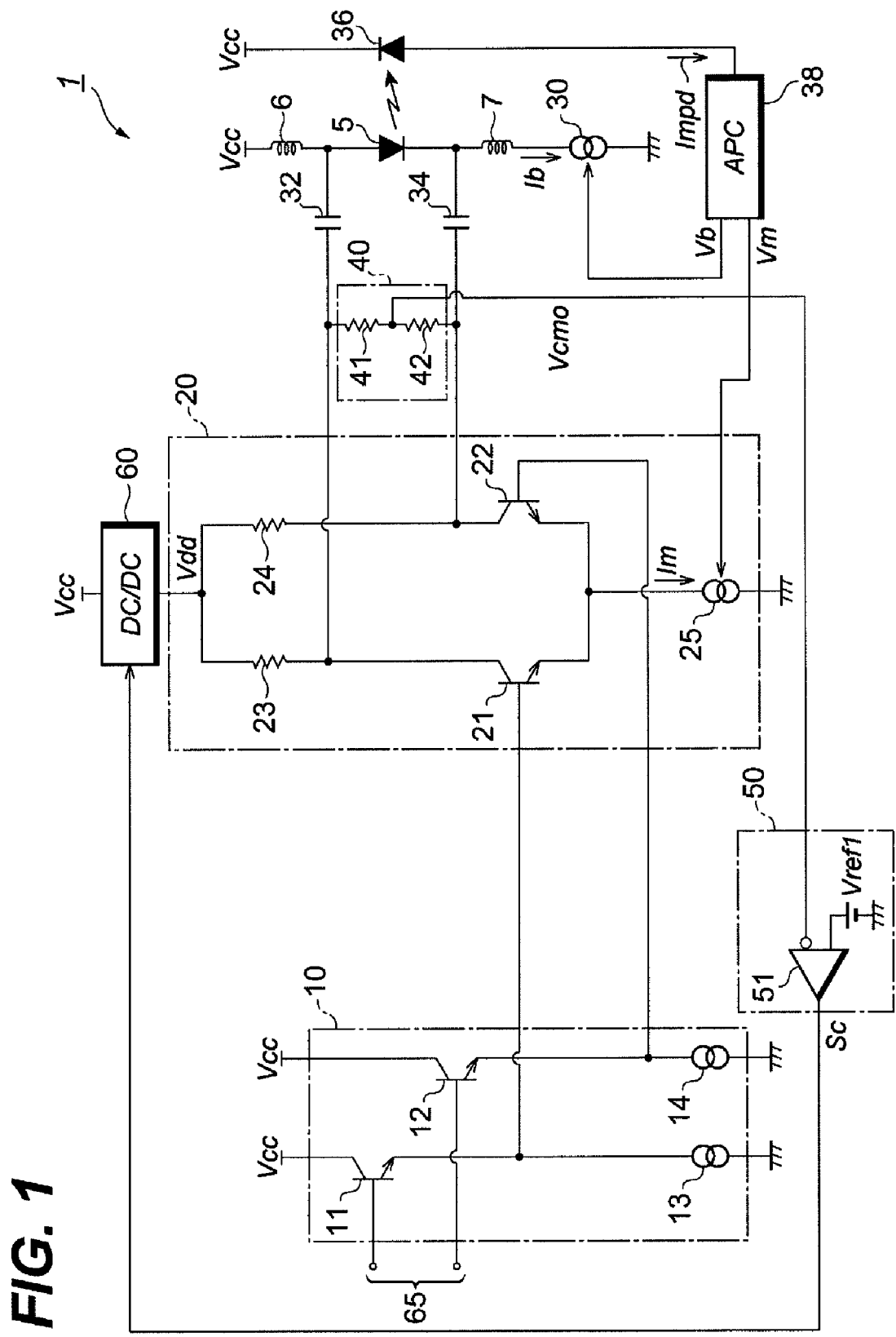
FIG. 1 illustrates a driver circuit for the semiconductor laser diode according to the first embodiment of the invention.

FIG. 1 is a diagram of a driver circuit for a semiconductor laser diode according to the first embodiment of the present invention. The driver circuit 1 shown in FIG. 1 is comprised of a level shift unit 10, a differential unit 20, a bias current source 30, a photodiode (hereafter denoted as PD) 36, an auto-power control (hereafter denoted as APC) unit 38, a comparing unit 50 and a voltage converter (hereafter denoted as DC/DC converter) 60. The APC unit 38 constitutes an APC loop accompanied with the photodiode 36 and the bias current source 30, while, the DC/DC converter 60 combined with the comparing unit 50 operates a feedback control circuit combined with a detector unit 40.

The level shift unit 10 shifts the level of the driving signal input to the terminal 65. The level shift unit 10 includes two transistors, 11 and 12, and two current sources, 13 and 14. The transistors, 11 and 12, receive the input signal in the base thereof. The input signal is assumed to configure the differential mode, that is, the amplitudes thereof are substantially same, while, the phases are opposite with respect to each other. The each collector of the transistors, 11 and 12, is biased by the power supply Vcc, while, the emitters are connected with respective current sources, 13 and 14. Two outputs of the level sift unit 10 are set to be inputs of the differential unit 20.

The differential unit 20 supplies the modulation current Im generated in the modulation current source 25 to the laser diode (hereafter denoted as LD) 5 to modulate the LD 5; thus, the LD emits modulated light based on the driving signal whose level is shifted by the level shift unit 10. The differential unit 20 includes a pair of transistors, 21 and 22, whose collectors are biased by the output power Vdd of the voltage converter 60 through respective load resistors, 23 and 24. The emitters of the paired transistors, 21 and 22, are commonly connected with the modulation current source 25. The magnitude of the modulation current Im is controlled by the APC unit 38 by receiving the control signal Vm from the APC unit 38.

The outputs of the differential unit 20, which are drawn from the collector of the transistors, 21 and 22, are coupled with the LD 5 in the differential mode through the capacitors, 32 and 34, that is, one of the outputs is coupled with the anode of the LD 5 through the capacitor 32, while, the other output is coupled with the cathode of the LD 5 through the other capacitor 34. Between the outputs of the differential unit 20 is provided with the detector unit 40.

The anode of the LD 5, which receives one of the outputs of the differential unit 20, is biased by the power supply Vcc through an inductor 6, while, the cathode of the LD 5, which receives the other of the outputs of the differential unit 20, is coupled with the bias current source 30 through another inductor 7. The bias current source 30 provides the bias current Ib to the LD 5 by being provided with the control signal Vb from the APC unit 38. This bias current source 30 is isolated from the modulation current Im transmitted through the capacitors, 32 and 34, by providing with the inductors, 6 and 7.

The PD 36 is biased by the power supply Vcc in the cathode thereof, while, the anode thereof is coupled with the APC unit 38 to provide the monitor current Impd corresponding to a portion of the light emitted from the LD 5. The APC unit 38 generates two control signals, Vb and Vm, so as to keep the magnitude of the monitor current Impd provided from the PD 36. Because the monitor current Impd is substantially proportional with the average power of the light emitted from the LD 5, the APC unit 38 may substantially keep the average output power of the LD 5. The PD 36, the APC unit 38, the modulation current source 25 and the bias current source 30 constitute a negative feedback loop called as the APC to maintain the optical output of the LD 5 constant.

The detector unit 40 detects the common mode voltage Vcmo of the outputs from the differential unit 20. The detector unit 40 includes two resistors, 41 and 42, connected in series between two outputs. Intermediate node of two resistors, 41 and 42, which is the output of the detector unit 40, is coupled with the comparing unit 50. The comparing unit 50 generates a control signal Sc to the voltage converter 60 by comparing the common mode voltage Vcmo with the reference Vref1. That is, the comparing unit adjusts the output Vdd of the voltage converter 60 so as to set the common mode voltage Vcmo substantially equal to the reference Vref1. The comparing unit 50 may include an operational amplifier 51 with two inputs, one of which, the inverting input thereof, receives the common mode voltage Vcmo, while the other, the non-inverting input thereof, is coupled with the reference Vref1. This reference Vref1 is selected such that the paired transistors, 21 and 22, operate in a normal condition. The voltage converter 60 adjusts the bias voltage Vdd for the differential unit 20 following the control signal Sc provided from the comparing unit 50. Thus, the detector unit 40, the comparing unit, the voltage converter 60 and the differential unit 20 constitute a negative feedback loop. Thus, the driver circuit with the LD 5 constitutes the optical transmitter.

Figure 3:
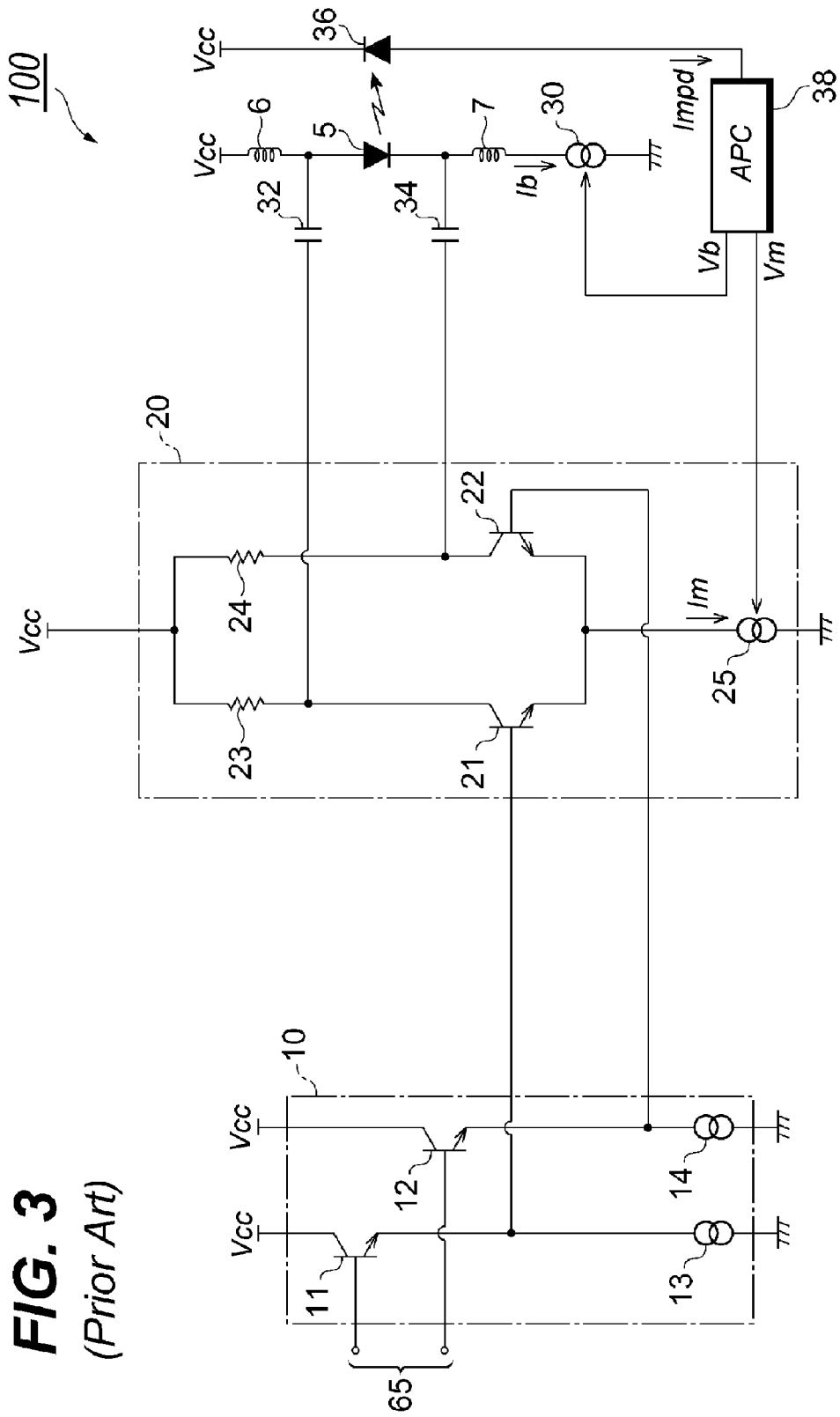
FIG. 3 illustrates a conventional driver circuit for the semiconductor laser diode.

Next, the driver circuit 1 will be compared with a conventional driver circuit 100 illustrated in FIG. 3. The conventional driver circuit 100 is different in an aspect that the circuit 100 does not provide the detector unit 40, the comparing unit 50 and the voltage converter 60, namely, the negative feedback loop to adjust the power supply Vdd to the differential unit 20.

The LD 5 shows large temperature dependence; that is, the emission efficiency of the LD 5 decreases as the temperature thereof rises. Then, in order to keep the average power and the extinction ratio of the optical output from the LD 5 with respect to the temperature, it is necessary to provide a large driving current to the LD 5 at a high temperature. Moreover, the emission efficiency of each LD is widely scattered in individual LDs; accordingly, the magnitude of the bias current and the modulation current to be supplied to the LD become irregular.

In the conventional driver circuit 100, the monitor current Impd output from the PD 35 decreases when the emission efficiency of the LD 5 degrades due to the increase of the temperature. Then, the APC unit 38 adjusts two control signals, Vb and Vm, so as to increase the bias current Ib and the modulation current Im. Increasing the modulation current Im, which increases the voltage drop by the load resistors, 23 and 24, the collector level of the paired transistor, 21 and 22, decreases, which disarranges the bias condition of the transistor, 21 and 22. It is necessary to raise the power supply Vcc in order to set the operating point of the paired transistor, 21 and 22.

For instance, it is well known that, when the operating temperature of the LD 5 increases to 85° C., the modulation current Im is necessary to be set about twice as much as that in the room temperature. Moreover, the modulation current Im is necessary to be as much as about 80 mA taking the individual scattering of the LD into account. Then, the power supply Vcc necessary in the conventional driver circuit 100 becomes about 3.3 V according to the following equation;

$$Vcc=Ve+Vce+RL\times Im/2,$$

where Ve~0.4 V, Vce~0.9 V and RL~50Ω are the emitter bias of the transistor 21, the bias between the collector and the emitter, and the resistance of the load resistor 23.

Assuming that the LD 5 shows an average emission efficiency, the modulation current Im necessary to keep the extinction ratio of the light output from the LD 5 becomes about 60 mA even at an operating temperature of 85° C. In this case, the power supply Vcc to be supplied to the differential unit becomes only 2.8 V according to equation above described. However, even under such a condition, the conventional driver circuit 10 is necessary to set higher power supply Vcc taking the scattering of the emission efficiency of individual LDs into account, which is one of interferences for the power saving.

On the other hand, the driver circuit according to the embodiment shown in FIG. 1 may set the power supply Vdd provided from the voltage converter 60 in a minimum necessary to operate the differential unit 20 adequately depending on the operating temperature and the emission efficiency of the LD 5.

When the operating temperature of the LD 5 in the driver circuit 1 of the present embodiment, which decreases the emission efficiency of the LD 5, the monitor current Impd output from the PD 36 decreases. Then, the APC unit 38 adjusts two control signals, Vb and Vm, so as to increase the bias current Ib and the modulation current Im. Increasing the modulation current Im, which lowers the common mode voltage Vcmo of the output from the detector unit 40; consequently, the control signal Sc is raised by the comparing unit 50, which increases the output Vdd of the voltage converter 60, namely, the positive power supply for the differential unit 20 to set the bias condition of the paired transistors, 21 and 22, adequately, which provides the optimum modulation current Im for the LD 5 to maintain the preset average output power and extinction ratio.

In a case when the modulation current decreases, the detector unit 40 outputs a raised common mode signal Vcmo, which decreases the control signal Sc output from the comparing unit 50. Then, the voltage converter 60, receiving this control signal Sc, decreases the output Vdd thereof, which also adjusts the operating condition of the paired transistors, 21 and 22, and sets the output power and extinction ratio of the LD adequately. Under this condition, the power consumption of the driver circuit 1 may decrease because the positive power supply Vdd of the differential unit 20 decreases.

In another condition where the LD 5 shows a large variation in the emission efficiency thereof, the feedback loop of the detector unit 40, the comparing unit 50 and the voltage converter 60 adequately adjusts the positive power supply Vdd of the differential unit 20 following the variation of the modulation current Im determined by the APC loop. That is, when the LD 5 shows a good emission efficiency, which decreases the modulation current Im, the feedback loop described above decreases the positive power supply Vdd. On the other hand, when the LD 5 shows a lesser emission efficiency and the modulation current Im determined by the APC loop increases, the feedback loop increases the positive power supply Vdd to set the operating condition of the paired transistors, 21 and 22, in the differential unit 20. Thus, the driver circuit 1 according to the present embodiment may maintain the average power and extinction ration of the light output from the LD 5 in the preset conditions by varying the positive power supply for the differential unit 20 dynamically without setting an excess range of the power supply.

Second Embodiment

Figure 2:
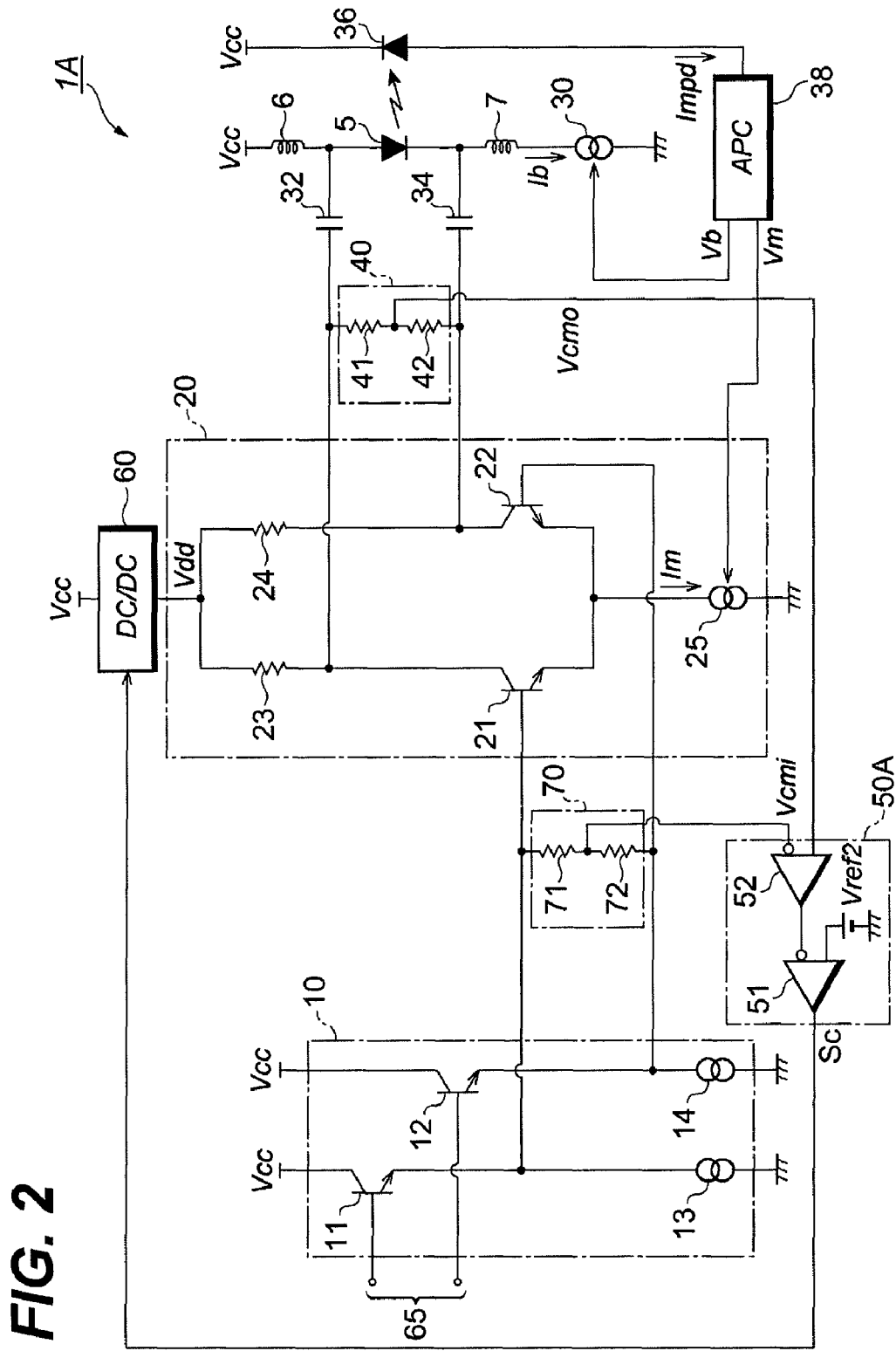
FIG. 2 illustrates another driver circuit according to the second embodiment of the invention, which modified from the driver circuit shown in FIG. 1.

FIG. 2 illustrates another driver circuit according to the second embodiment of the invention, which is one type of modifications of the driver circuit 1 shown in FIG. 1. The modified driver circuit 1A provides a comparing unit 50A instead of the unit 50 of the first driver circuit 1 and the second detector unit 70.

The second detector unit 70 detects an input common mode signal Vcmi by providing two resistors, 71 and 72, each connected with the outputs of the level shift unit 10. Between two resistors, 71 and 72, is coupled with the comparing unit 50A.

The modified comparing unit 50A generates the control signal Sc that is adjusted so as to set a difference between the input and output of the differential unit 20 in the second reference Vref2. Specifically, the comparing unit 50A provides an additional operational amplifier 52 in the upstream of the first operational amplifier 51. The inverting input of the second amplifier 52 receives the input common mode signal Vcmi, while, the non-inverting input of the second amplifier 52 receives the output common mode signal Vcmo. The output of this second amplifier 52 is provided to the inverting input of the first amplifier 51 to be subtracted from the second reference Vref2 input to the non-inverting input of the amplifier 51. The second reference Vref2 is set such that the paired transistors, 21 and 22, in the differential unit 20 normally operate in a forward bias condition where at least the output common mode voltage Vcmo is greater than the input common mode voltage Vcmi.

A variation in the performance and the temperature dependence of respective circuit elements in the level shift unit 10 or circuits in the upstream thereof occasionally shifts the level of the modulation signal input to the differential unit 20, which may set the operating point of the paired transistors, 21 and 22, in an inadequate condition, even when the output common mode voltage Vcmo is set in an adequate level.

According to the driver circuit 1A, the additional detector unit 70 detects the input common mode voltage Vcmi and the feedback control of the comparing unit 50A with the voltage converter 60 adjusts the positive power supply Vdd for the differential unit 20 so as to set the difference between the input common mode level Vcmi and the output common mode level Vcmo in the preset reference Vref2. Therefore, even when the input common mode voltage Vcmi varies due to various reasons, the feedback control above described dynamically adjust the positive power supply Vdd to set the operating point of the paired transistors, 21 and 22, in an adequate condition.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims. For example, the embodiments concentrate of a case where the level shift unit 10 and the differential unit 20 are implemented with bipolar transistors. However, it would be easily understood that field effect transistors may be easily implemented in the units, 10 and 20.

In a case where the differential unit 20 is implemented with MOS transistors, the feedback control dynamically adjusts the positive power supply Vdd such that the MOS transistors operate in, what is called, a saturation region:

$$Vcmo-Vs>Vcmi-Vth-Vs,$$

where Vs and Vth are the source voltage and the threshold voltage of the MOS, respectively. The feedback control may lower the output common mode voltage Vcmo to a value lower than the threshold voltage with respect to the input common mode voltage Vcmi. Under this condition, the positive power supply Vdd becomes:

$$Vdd=Vcmi-Vth+RL\times Im/2.$$

The present invention, therefore, is limited only as claimed below and the equivalents thereof.

What is claimed is:

1. A driver circuit to drive a semiconductor laser diode in a differential mode, comprising:
    a differential unit including a pair of transistors, each transistor coupled with a power supply through a load resistor to configure a differential circuit, said differential unit further including two inputs and two outputs, said two outputs being provided from said pair of transistors, said laser diode being coupled between said two outputs to be provided with a modulation current;
    a voltage converter configured to provide said power supply to said differential unit;
    a first detector unit including a pair of resistors to detect a first common mode level of said two outputs of said differential unit, said pair of resistors being connected in series between said two outputs to generate said common mode level from an intermediate node of said pair of resistors; and
    a second detector unit configured to detect a second common mode level of said two inputs of said differential unit: and
    a comparing unit configured to compare said first common mode level output from said first detector unit with said second common mode level, to compare said comparison with a reference, and to generate a control signal corresponding to said comparison with said reference,
    wherein said comparison between said first common mode level and said second common mode level is set equal to said reference by adjusting said power supply by said control signal.

2. The driver circuit according to claim 1,
    wherein said driver circuit further comprising a photodiode, a bias current source, a modulation current source and an APC unit, said bias current source being connected in series to said laser diode, said modulation current source being coupled with said paired transistor to provide said modulation current, and
    wherein said photodiode, said bias current source, said modulation current source and said APC unit constitute an automatic power control loop to keep an average power and an extinction ratio of light output from said laser diode constant.

3. The driver circuit according to claim 2,
    wherein each of said two outputs of said differential unit is coupled with said laser diode through a capacitor.

4. A driver circuit to drive a semiconductor laser diode in a differential mode, comprising:
    a voltage converter to provide a power supply to said driver circuit;
    a differential circuit including a pair of transistors each transistor coupled with a power supply through a load resistor, said differential circuit further including two inputs and two outputs, said laser diode being coupled between said two outputs;
    a first detector unit for detecting an output common mode level of said two outputs;
    a second detector unit for detecting an input common mode level of said two inputs;
    a comparing unit for generating a first comparison between said output common mode level and said input common mode level, and a second comparison between said first comparison and a reference level,
    wherein said second comparison is set equal to said reference level by varying said power supply based on said second comparison.

5. The driver circuit according to claim 4,
    wherein each of said two outputs of said differential unit is coupled with said laser diode through a capacitor.

6. The driver circuit of claim 4, further comprising:
    a modulation current source installed in said differential circuit, a bias current source connected in series to said laser diode, and an automatic power control loop,
    wherein said automatic power control loop includes a photodiode for detecting an optical power output from said laser diode, an APC unit, said bias current source and said modulation current source; said APC unit adjusting said bias current source and said modulation current source such that said laser diode emits light with a preset average power and a preset extinction ratio.

* * * * *